United States Patent
Ito et al.

(10) Patent No.: US 6,938,336 B2
(45) Date of Patent: Sep. 6, 2005

(54) METHODS OF MANUFACTURING BOARD HAVING THROUGHHOLES FILLED WITH RESIN AND MULTI-LAYERED PRINTED WIRING BOARD USING THE BOARD

(75) Inventors: Toshihide Ito, Toyama (JP); Satoshi Nakamura, Tokyo (JP)

(73) Assignee: NEC Toppan Circuit Solutions, Inc., Tokyo (JP)

( * ) Notice: Subject to any disclaimer, the term of this patent is extended or adjusted under 35 U.S.C. 154(b) by 326 days.

(21) Appl. No.: 10/272,915

(22) Filed: Oct. 18, 2002

(65) Prior Publication Data

US 2003/0074790 A1 Apr. 24, 2003

(30) Foreign Application Priority Data

Oct. 22, 2001 (JP) .......................... 2001-323243

(51) Int. Cl.[7] ................................. H01K 3/10
(52) U.S. Cl. .............. 29/852; 29/846; 29/853; 29/847; 29/848; 29/849; 29/850; 29/851; 174/255; 174/261; 428/209
(58) Field of Search ................. 29/846–853; 174/255, 174/261; 428/209

(56) References Cited

U.S. PATENT DOCUMENTS

| 6,242,079 B1 * | 6/2001 | Mikado et al. ............ 428/209 |
| 6,376,049 B1 * | 4/2002 | Asai et al. ................. 428/209 |
| 6,512,186 B1 * | 1/2003 | Nishiwaki et al. .......... 174/261 |
| 6,532,651 B1 * | 3/2003 | Andou et al. ................ 29/852 |

* cited by examiner

*Primary Examiner*—Carl J. Arbes
*Assistant Examiner*—Tim Phan
(74) *Attorney, Agent, or Firm*—Burns, Doane, Swecker & Mathis, L.L.P.

(57) ABSTRACT

A resin filled board is manufactured by forming roughened surfaces on a conductive layer in a throughhole before it is filled with a resin, forming smooth surfaces on conductive layers on the top and bottom of the board, printing the resin using a mask having an opening at a position corresponding to the throughhole to selectively fill the resin in the throughhole, and curing the resin. In this way, the surface of the conductive layer around the throughhole is smoothed, so that hardly any of the resin remains on the surfaces near the throughhole when the surfaces of the board is mechanically polished after the resin is cured. Also, the filling resin will not fall down into the throughhole.

13 Claims, 6 Drawing Sheets

METHODS OF MANUFACTURING BOARD HAVING THROUGHHOLES FILLED WITH RESIN AND MULTI-LAYERED PRINTED WIRING BOARD USING THE BOARD

CROSS REFERENCE TO RELATED APPLICATIONS

The application claims priority under 35 U.S.C. §119 to Japanese Application No. 2001-323243, filed Oct. 22, 2001, the entire content of which is hereby incorporated by reference.

BACKGROUND OF THE INVENTION

1. Field of the Invention

The present invention relates to a method of manufacturing a resin filled board and a method of manufacturing a multi-layered printed wiring board using the resin filled board. More specifically, the present invention relates to a method of manufacturing a resin filled board by selectively filling a resin in throughholes of the board through printing, and a method of manufacturing a multi-layered printed wiring board, i.e., a so-called multi-layered build-up wiring board by building up an insulating resin and a conductive layer on core board which is the resin filled board manufactured by the method.

2. Description of the Related Art

The manufacturing of a multi-layered build-up wiring board involves previously filling throughholes of a core board with a resin to planarize the surface of the core board before the core board is formed with a build-up layer made of an insulating resin. This is because the formation of the build-up layer without planarization would cause the build-up layer to fall into the throughholes of the board to lose the planarity, thereby failing to correctly form a resist on the build-up layer and openings through laser processing in subsequent steps, with the result that a defective multi-layered build-up wiring board is produced.

Referring now to FIGS. 1a to 1e, description will be made on a method of manufacturing a resin filled board (core board) for use in a conventional build-up multi-layered wiring board and the like.

First, as illustrated in FIG. 1a, hole 2 is formed through insulating resin board 1 having copper foils adhered on both sides thereof, followed by formation of conductive layers 3 on the surfaces of board 1 and on the wall surface of hole 2 through plating such as copper plating. It should be noted that the underlying copper foils on the surfaces of board 1 are omitted in the figures. A hole formed between top and bottom conductive layers 3 is referred to as "throughhole" 4.

Next, the surfaces of conductive layers 3 are roughened to form rough surfaces 5 as illustrated in FIG. 1b, and then filling resin 6 is filled in throughholes 4 as illustrated in FIG. 1c. Generally, the filling resin is a mixture mainly composed of an epoxy resin and an inorganic filler. Filling resin 6 may include an accelerator, a reactive diluent, a surface active agent, and a viscosity modifier for improving the workability and yield factor of the filling. The viscosity of filling resin 6 is adjusted approximately in a range of 10 to 100 Pa·s. Filling resin 6 is filled in throughholes 4 by printing it at positions corresponding to throughholes 4 using a screen plate or a metal mask which is formed with dots extending therethrough and having a diameter slightly larger than throughhole 4.

Next, filling resin 6 is thermoset at temperatures ranging from 130 to 180° C. FIG. 1d illustrates filling resin 6 after it is cured. Finally, as illustrated in FIG. 1e, the surfaces of board 1 is polished using a belt sander or a buff to scrape off portions of filling resin 6 swollen from the surfaces of board 1 for planarization, thereby completing the core board.

The resin filling step places importance on perfect planarization of the surface of the core board, and high adhesivity of filling resin 6 with the surface of conductive layer 3 on the inner wall of each throughhole 4. For improving the adhesivity of filling resin 6 with the surface of conductive layer 3 on the inner wall of each throughhole 4, the conventional manufacturing method employs the roughening of the surface of conductive layer 3 including the inner wall of throughhole 4 before filling resin 6 is filled in throughholes 4, as illustrated in FIG. 1b. This roughening approach forms miniature ruggedness on the surfaces of the conductive layer on the inner wall of each throughhole 4 to increase the area of the surface which contacts filling resin 6 later filled in throughhole 4 to increase the adhesivity. Techniques describing such a roughening approach are disclosed in JP-A-10-13029, JP-A-10-4261, JP-A-2000-40863, and the like.

When the surfaces of conductive layers 3 on board 1 are roughened before filling resin 6 is filled in throughhole 4, filling resin 6 is filled along the miniature ruggedness on the surface of conductive layer 3 on the inner wall of each throughhole 4 after filling resin 6 is thermoset, so that the adhesion interface is expanded between the surface of conductive layer 3 on the inner wall of each throughhole 4 and filling resin 6 to advantageously improve the adhesivity.

However, since the roughening is conducted over the entire copper layer exposing on the surfaces of board 1, the surfaces of conductive layers 3 on the top and bottom of board 1 as well as on the inner wall of each throughhole 4 are affected by the roughening to result in a rough surface having the miniature ruggedness.

Filling resin 6 printed after the roughening step once softens in the process of naturally increased temperature, when it is thermoset, so that its viscosity becomes lower. In this event, filling resin 6 with a reduced viscosity, particularly, the epoxy resin component which includes no inorganic filler, exudes between the miniature ruggedness formed on the surface of conductive layer 3 on each side of board 1 by the action of osmotic pressure. As a result, when throughholes 4 are arranged at a narrow pitch, for example, 0.5 mm or less, portions of filling resin 6 exuding from adjacent throughholes 4 come in contact and join together, as illustrated in FIG. 1d. More specifically, observation on filling resin 4 swollen over the entire core board reveals that the finished board includes a mixture of portions of filling resin 4 each individually protruding on throughholes 4 arranged at a wide pitch and portions of filling resin 6 joined together over a plurality of throughholes 4 arranged at a narrow pitch.

With the core board thus finished, the individual protrusions of filling resin 6 are readily scraped off in the next polishing step for scraping off swollen filling resin 6. While the individual protrusions of filling resin 6 are completely removed to achieve the planarization of the board, the portions of filling resin 6 joined together over a plurality of throughholes 4 cannot be fully scraped off, resulting in polishing residue 7 as illustrated in FIG. 1e. If the core board is additionally polished to completely remove polishing residue 7, the individual protrusions of filling resin 6 can be excessively scraped off to cause a defective core board which has the conductive layer of a thickness smaller than a prescribed value.

As illustrated in FIG. 1d, as filling resin 6 exudes around throughholes 4 and spreads thereover, printed filling resin 6 is less swollen. In addition, since overall filling resin 6 drops naturally through gravity due to the softening of the resin experienced in the middle of increasing temperature during the thermosetting, the resulting core board may have deep recesses in throughholes 4. Such deep recesses in throughholes 4 cause recess 6a on the surface of the core board after the polishing step, as illustrated in FIG. 1e, thereby failing to form a flat core board.

As appreciated from the foregoing, the roughening before filling resin 6 is filled in throughholes 4 advantageously improves the adhesivity of filling resin 6 with the surface of conductive layer 3 on the inner wall of each throughhole 4, whereas a board which partially includes throughholes at a narrow pitch would experience difficulties in uniformly filling all throughholes with the filling resin due to the roughening and have recesses in the throughholes to damage the planarity of the core board. The damaged planarity on the surface of the core board would cause air voids to be trapped on the interface between the core board and build-up resin layer, and reduce the planarity on the surface of the build-up resin layer.

The foregoing problem would impede the formation of a resist by photography, and the formation of correct openings through the resin by laser processing to reduce the yield factor. The air voids trapped in the interface between the core board and build-up resin layer also reduce the adhesivity of the build-up resin layer with the core board. The insufficient adhesivity would cause cracking within the multi-layered build-up wiring board, starting from a throughhole of the resin filled board which is the core board. In the worst case, the cracking would result in a broken conductive path on the build-up layer.

SUMMARY OF THE INVENTION

It is an object of the present invention to provide a method of manufacturing a resin filled board and a method of manufacturing a multi-layered printed wiring board using the resin filled board, which can solve the problems of the prior art.

According to one aspect of the present invention, a method of manufacturing a resin filled board includes forming a roughened surface on the conductive layer in the throughhole before the throughhole is filled with the resin, forming smooth surfaces on the conductive layers formed on the top and bottom of the board, printing the resin using a mask having an opening at a position corresponding to the throughhole to selectively fill the throughhole with the resin, and curing the resin.

Since the conductive layer has been smoothed on the surfaces of the board when a filling resin is filled, the filling resin will not exude and spread over the surfaces of the conductive layers on the board. As a result, portions of the filling resin filled in throughholes formed at a narrow pitch will not join together, thereby reducing variations in the state of the filling resin filled in throughholes at a narrow pitch and the filling resin filled in throughholes at a normal pitch. For this reason, the resin hardly remains on the surfaces near the throughhole when the surfaces of the board are mechanically polished after the resin is cured, and the filling resin will not fall down into the throughholes.

The board having the throughhole filled with the resin can be prepared by forming a hole extending through a copper-clad laminate or an insulating board, and plating copper over the board.

The formation of the roughened surfaces on the conductive layer in the throughhole and the smooth surfaces on the conductive layers formed on the top and bottom of the board may include chemically treating the surfaces of the conductive layers in the throughhole and on the top and bottom of the board to form roughened surfaces on the conductive layers in the throughhole and on the top and bottom of the board, and mechanically polishing only the surfaces of the conductive layers on the top and bottom of the board to form the smooth surfaces on the conductive layers on the top and bottom of the board. The chemical treatment in this event may be made using a blackening reduction solution, a water solution of peroxide, a water solution of inorganic acid and peroxide, or a water solution of organic acid and cupric complex. Also, the surface of the conductive layer may be mechanically polished using a buff.

The board filled with the resin may include a conductive layer on the board previously formed into a predetermined pattern.

The mask may be a screen plate or a metal mask. The opening of the mask preferably has a diameter 1.1 to 2.5 times larger than the diameter of the throughhole.

The method may further include mechanically polishing a portion of the resin excessively protruding from the board for removal to planarize the surface of the board after printing the resin to selectively fill the throughhole with the resin, and curing the resin.

The resin may be a thermosetting resin or a photo-thermosetting resin, or a thermosetting resin including a conductive powder.

According to another aspect of the present invention, a method of manufacturing a multi-layered printed wiring board includes the steps of patterning a first conductive layer on the surface of a board manufactured by using the method of manufacturing a resin filled board according to the present invention, forming an insulating resin layer on at least one side of the board, and forming a second conductive layer on the surface of the insulating resin layer.

According to a further aspect of the present invention, a method of manufacturing a multi-layered printed wiring board includes the steps of forming an insulating resin layer on at least one side of a board having a first conductive layer previously patterned thereon, which is manufactured by using the method of manufacturing a resin filled board according to the present invention, and forming a second conductive layer on the surface of the insulating resin layer.

The method of manufacturing a multi-layered printed wiring board according to the present invention provides a high density multi-layered build-up wiring board which excels in reliability.

The above and the other objects, features and advantages of the present invention will become apparent from the following description with reference to the accompanying drawings which illustrate examples of the present invention.

DESCRIPTION OF THE PREFERRED EMBODIMENTS

Referring now to FIGS. 2a to 2e, description will be made on a method of manufacturing a resin filled board according to a first embodiment of the present invention.

Figure 1A:
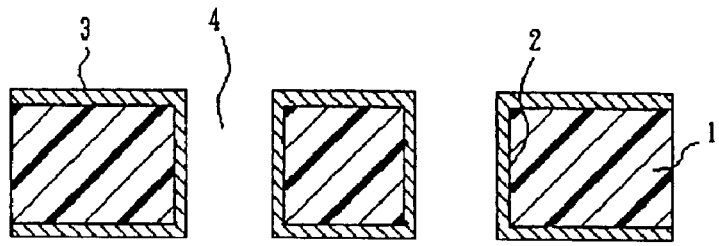
FIGS. 1a to 1e are cross-sectional views of a main portion of a board for describing steps in a method of manufacturing a resin filled board (core board) for use in a conventional build-up multi-layered wiring board.
Figure 1B:
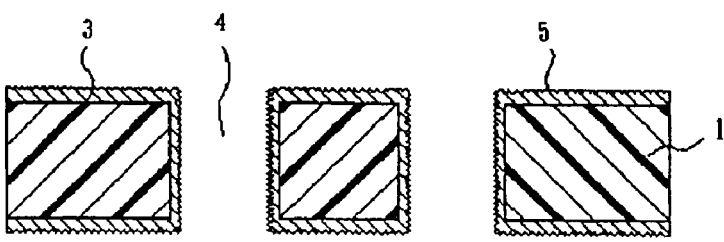
Figure 1C:
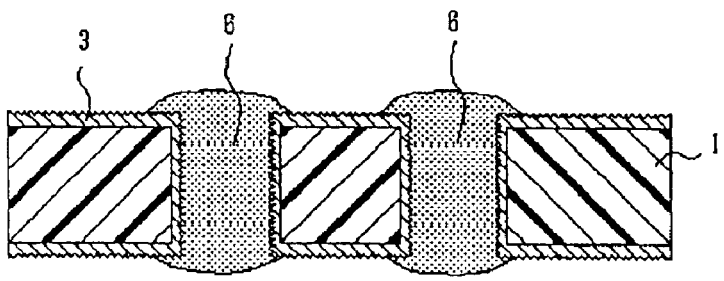
Figure 1D:
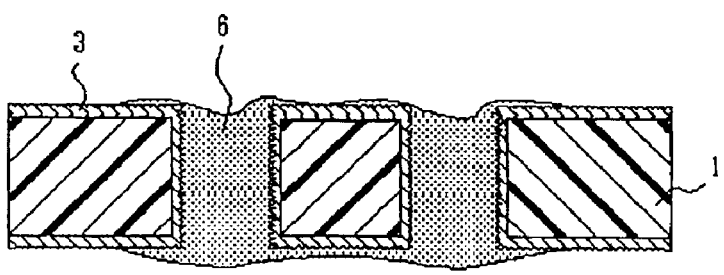
Figure 1E:
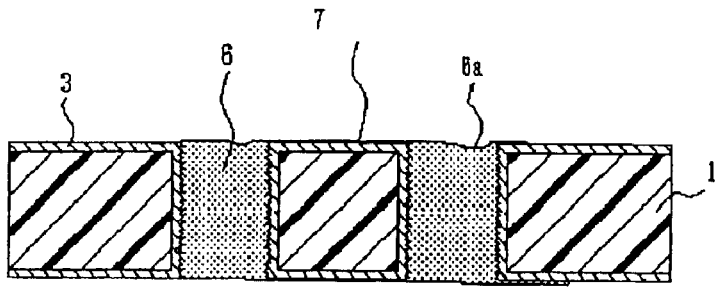
Figure 2A:
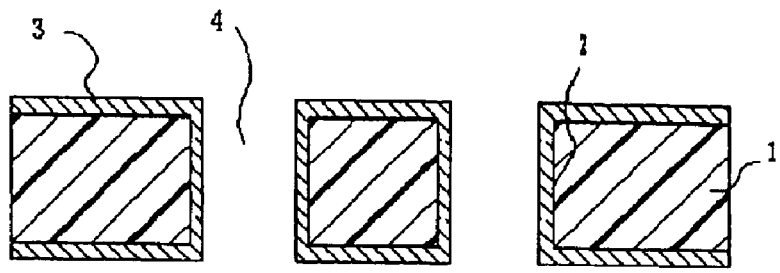
FIGS. 2a to 2e are cross-sectional views of a main portion of a board for describing steps in a method of manufacturing a resin filled board according to a first embodiment of the present invention.

First, as illustrated in FIG. 2a, holes 2 are formed through insulating board 1 having copper foils adhered on both sides thereof, followed by formation of conductive layers 3 on the surfaces of board 1 and on the wall surfaces of holes 2 through plating such as copper plating. It should be noted that the underlying copper foils on the surfaces of board 1 are omitted in the figures. A hole formed with conductive layer 3 is referred to as "throughhole" 4. Insulating board 1 may be made of a board without copper foils adhered thereon, i.e., a so-called unclad insulating board.

Materials suitable for insulating board 1 may include a glass fiber containing epoxy resin material, a glass fiber containing BT (bismalleic imide—triazine) resin material, a glass fiber containing polyimide resin material, and a glass fiber containing PPF (polyphenylene ether) resin material. Instead of the glass fiber, a polyester fiber and an aramide fiber may be used as a reinforcement for these materials. Further alternatively, a ceramic board and a metal board may be used for insulating board 1.

The resin for insulating board 1 is not limited to the epoxy resin, BT resin, polyimide, and PPE, but may be a phenol resin, a PTFE (polytetrafluoroethylene) resin, a silicon resin, a polybutadiene resin, a polyester resin, a melanin resin, a urea resin, a PPS (polyphenylenes sulfide) resin, a PPO (polyphenylene oxide) resin, and the like.

Figure 2B:
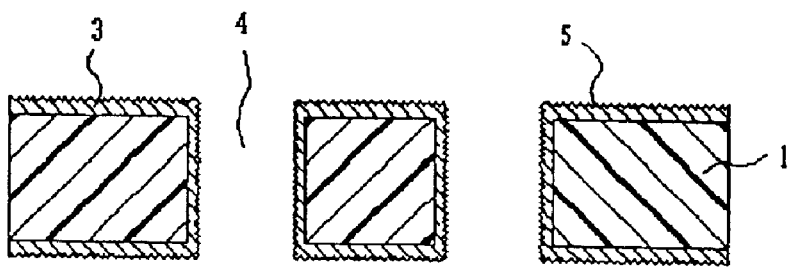

Next, the surfaces of conductive layers 3 are roughened to form rough surfaces 5 having miniature ruggedness on the surfaces of conductive layers 3, as illustrated in FIG. 2b. The roughening is conducted simultaneously on the surface of conductive layer 3 on the inner wall of each throughhole 4 and on the surfaces of conductive layers 3 on the top and bottom of board 1. A roughening liquid for use in this step may be a mixed oxidizing solution, for example, comprised of 40–70 g/L of sodium zincate, 5–20 g/L of sodium hydroxide, and 5–20 g/L of trisodium phosphate. Board 1 is immersed in this solution at 25–30° C. for 10–30 seconds for oxidation until the surfaces of conductive layers 3 made of copper change in color to reddish brown. Other than the foregoing solution, used as the roughening liquid may be a blackening reduction solution, a solution of inorganic acid and peroxide, a solution of organic acid and cupric complex, or a micro etchant which is a solution including a main agent comprised of inorganic acid and copper oxidizing agent and an assistant comprised of an azole group and an etching inhibitor.

Figure 2C:
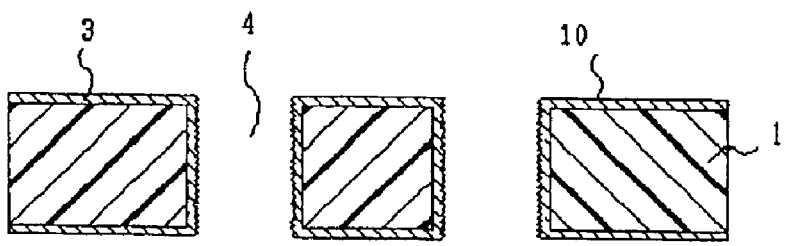

Next, as illustrated in FIG. 2c, both surfaces of board 1 are polished using a buff made of unwoven fabric to mechanically remove roughened surfaces 5 on board 1 to form smooth surfaces 10. The buff polishing is conducted under the conditions of a buff rotational speed set at 1600 rpm, a pressurizing current set at 1.0 A, and a board feeding speed set at 1.0 m/minute. The buff is forwardly rotated to polish board 1 while water is sprayed thereon to scrape off conductive layer 3 in a thickness of 0.5 to 3 $\mu$m until the surfaces of conductive layers 3 returns from the reddish brown or dark brown, resulting from the roughening, to a glossy copper color. Each of the top and bottom of core board 1 is polished with the buff. The surfaces of conductive layers 3 on board 1, which have recovered the glossy copper color, are planarized by removing the miniature ruggedness formed by the roughening, while the surface of conductive layer 3 on the inner wall of each throughhole 4 remain in reddish brown or dark brown and still have the miniature ruggedness.

Figure 2D:
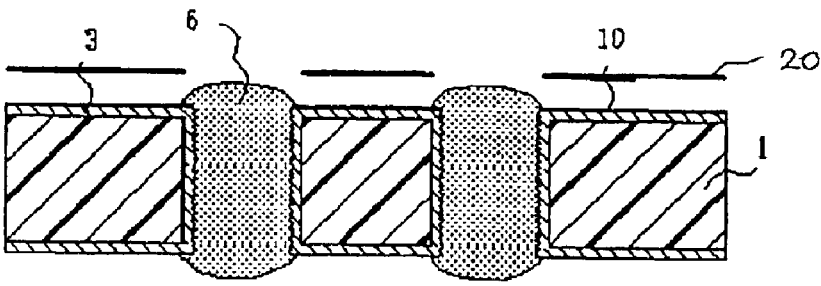

Next, as illustrated in FIG. 2d, filling resin 6 is printed to fill throughholes 4 with filling resin 6 using mask 20 which has openings at positions corresponding to throughholes 4. FIG. 2d illustrates that mask 20 is separated from board 1 after throughholes 4 have been filled with filling resin 6 using mask 20.

Mask 20 used herein may be a screen plate or a metal mask. The openings of mask 20 each have a diameter 1.1 to 2.5 times larger than the diameter of throughholes 4, and are opened in dot shape. Filling resin 6 is adjusted to have a viscosity in a range of 10 to 100 Pa·s, and is squeezed on mask 20 to be filled in throughholes 4 of board 1. Filling resin 6 is filled in throughholes 4 and swollen on both sides of board 1. Board 1 is heated at temperature of 150° C. for one hour to thermoset filling resin 6. Since the miniature ruggedness on conductive layers 3 on the top and bottom of core board 1, formed by the roughening, has been removed to planarize core board 1, filling resin 6 will not exude in course of the thermosetting, so that filling resin 6 can substantially hold the shape when it was printed. Filling resin 6 in throughholes 4 closely and firmly adheres to the surface of copper on the inner wall of each throughhole 4 which are roughened to have the miniature ruggedness.

While epoxy resin is used for the material of filling resin 6, the epoxy resin may be replaced with a BT resin, a polyimide resin, a PPE resin, a phenol resin, a PTFE resin, a silicon resin, a polybutadiene resin, a polyester resin, a melanin resin, a urea resin, a cardo resin, or the like. A plurality of these resins may be used. Filling resin 6 may also contain a filler. The filler may be silica, barium sulfate, talc, clay, glass, graphite, carbon, and any of a metal group such as copper, and the like. Instead of an inorganic filler, an organic filler may be used, or a mixture of an inorganic and an organic filler may be used. Further alternatively, a copper paste, a silver paste, and the like may be used.

Figure 2E:
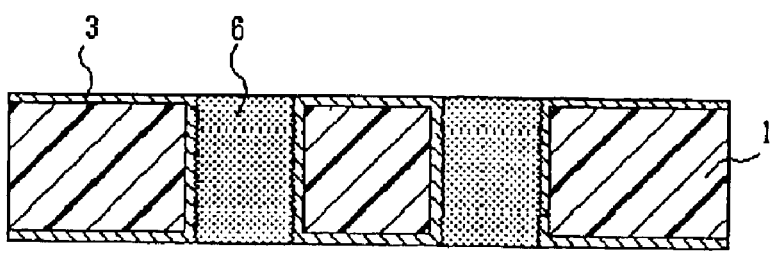

Next, as illustrated in FIG. 2e, both sides of board 1 are polished by mechanical polishing such as buff polishing using a ceramic buff, belt sander polishing, or the like to scrape off swollen portions of filling resin 6 protruding from the surfaces of board 1 to planarize board 1 which has throughholes 4 filled with filling resin 6.

The method of manufacturing a resin filled board according to the first embodiment can prevent voids in filling resin 6 filled in throughholes 4 to provide a highly reliable resin filled board. Consequently, it is possible to provide, with a high yield factor, a resin filled board which is highly densely formed with throughholes at a narrow pitch of 0.5 mm or less.

The reason for providing the foregoing advantage will be described below. As illustrated in FIG. 2c, the surface of each conductive layer 3 on board 1 before filling resin 6 is filled includes roughened surface 5 which is roughened to have miniature ruggedness such as the surface of conductive layer 3 on the inner wall of each throughhole 4, and smooth surface 10 resulting from the buff polishing such as conductive layers 3 on the top and bottom of board 1.

As illustrated in FIG. 2d, filling resin 6 is printed in dot shape to be filled in throughholes 4 and swollen on both sides of board 1. In the course of rising temperature during thermosetting, filling resin 6 once softens to reduce the viscosity. Since filling resin 6 having a lower viscosity exudes and spreads over roughened surface 5, filling resin 6 sufficiently closely adheres to the inner wall of each throughhole 4. On the other hand, since filling resin 6 hardly spreads over the surface of conductive layer 3 (smooth surface 10) on board 1 which is polished for planarization, filling resin 6 can substantially hold the same shape as when it was printed even after the thermosetting, as illustrated in FIG. 2d.

Thus, portions of filling resin 6 swollen on both sides of board 1 after printing will not join together even if throughholes 4 are formed at a narrow pitch, and individually maintain the swollen shape. Such individual protrusions of filling resin 6 can be uniformly polished in the step illustrated in FIG. 2e without leaving unpolished filling resin 6.

Also, since filling resin 6 swollen on both sides of board 1 after printing does not spread over the surfaces of board 1, filling resin 6 will not fall down below the top of board 1. For this reason, filling resin 6 filled in throughholes 4 will not fall down thereinto after polishing.

Next, description will be made on a method of manufacturing a resin filled board according to a second embodiment of the present invention. The second embodiment involves forming a conductive path on a surface of a board, roughening a conductive layer, planarizing only surfaces of the conductive path including those around throughholes on both sides of the board, and filling the throughholes with a filling resin.

Figure 3A:
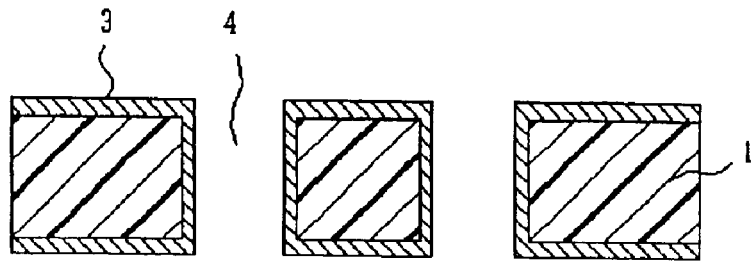
FIGS. 3a to 3e are cross-sectional views of a main portion of a board for describing steps in a method of manufacturing a resin filled board according to a second embodiment of the present invention.

First, as illustrated in FIG. 3a, holes 2 are formed through insulating resin board 1 having copper foils adhered on both sides thereof, followed by formation of conductive layers 3 on the surfaces of board 1 and on the wall surfaces of holes 2 through plating such as copper plating. It should be noted that the underlying copper foils on the surfaces of board 1 are omitted in the figures. A hole formed between top and bottom conductive layers 3 is referred to as "throughhole" 4.

Figure 3B:
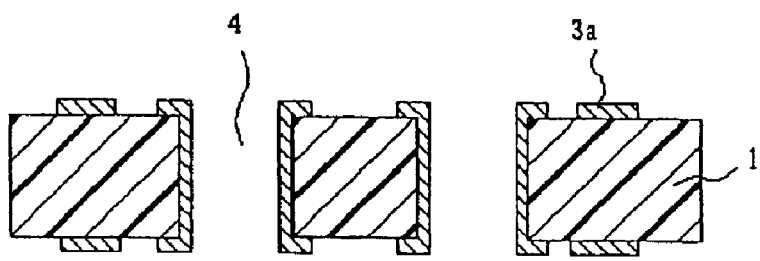

Next, as illustrated in FIG. 3b, conductive layer 3 on each side of board 1 is patterned by a normal etching technique to form conductive path 3a.

Figure 3C:
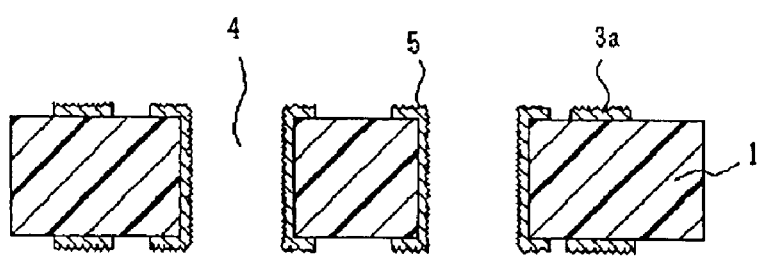

Next, as illustrated in FIG. 3c, the surfaces of conductive path 3a and conductive layer 3 on the inner wall of each throughhole 4 are roughened to form rough surfaces 5 in a similar approach to those used in the aforementioned first embodiment.

Figure 3D:
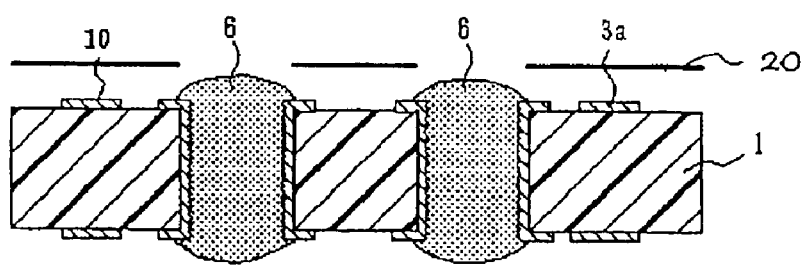

Next, as illustrated in FIG. 3d, both surfaces of board 1 are polished using a buff made of unwoven fabric to mechanically remove roughened surface 5 on board 1 to form smooth surface 10. Then, filling resin 6 is printed to fill throughholes 4 with filling resin 6 using mask 20 which has openings at positions corresponding to throughholes 4. Filling resin 6 is filled in throughholes 4 and swollen on both sides of board 1. Board 1 is heated at temperature of 150° C. for one hour to thermoset filling resin 6. Since the miniature ruggedness on conductive layers 3 on the top and bottom of core board 1, formed by the roughening, has been removed to planarize core board 1, filling resin 6 will not exude in course of the thermosetting, so that filling resin 6 can substantially hold the same shape as when it was printed. Filling resin 6 in throughholes 4 closely and firmly adheres to the surface of copper on the inner wall of each throughhole 4 which is roughened to have the miniature ruggedness.

Figure 3E:
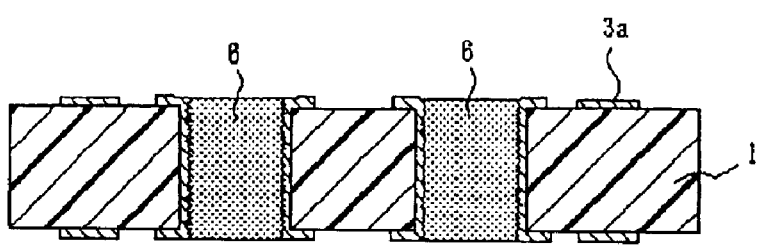

Next, as illustrated in FIG. 3e, both sides of board 1 are polished by mechanical polishing such as buff polishing using a ceramic buff, belt sander polishing, or the like to scrape off swollen portions of filling resin 6 protruding from the surfaces of board 1 to planarize board 1 which has throughholes 4 filled with filling resin 6, conductive path 3a formed on the surfaces, and filling resin 6 planarized at throughholes 4 on the surfaces of board 1.

Similar advantages to those of the second embodiment can be provided by, after the step illustrated in FIG. 3a, roughening the entire surfaces of board 1, planarizing the surfaces of conductive layers 3 on the surfaces of board 1, then patterning conductive layers 3 on the surfaces, and filling throughholes 4 with filling resin 6.

Next, description will be made on methods of manufacturing a multi-layered build-up wiring board using the resin filled board (core board) manufactured in the first and second embodiments. While the method described below relates to a method which is based on a semi-additive method to manufacture a multi-layered build-up wiring board, a full-additive method may be employed instead in the method of manufacturing a multi-layered build-up wiring board according to the present invention.

Referring to FIGS. 4a to 4e, described first will be a method of manufacturing a multi-layered build-up wiring board using the resin filled board (core board) manufactured in the first embodiment.

Figure 4A:
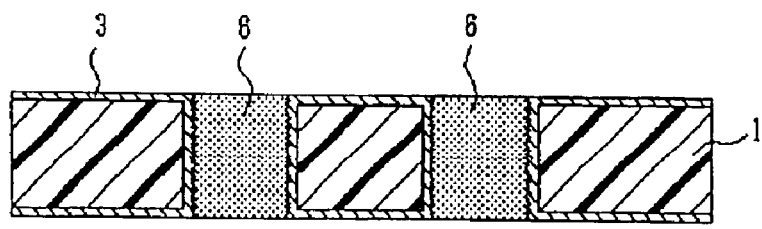
FIGS. 4a to 4e are cross-sectional views of a main portion of a board for describing steps in a method of manufacturing a multi-layered build-up wiring board using the resin filled board manufactured by the method described with reference to FIGS. 2a to 2e.

First, as illustrated in FIG. 4a, a resin filled board was prepared as manufactured by the manufacturing method described in connection with FIGS. 2a to 2e. A glass fiber contained epoxy resin copper-clad laminate was used for insulating board 1, while an epoxy resin was used for filling resin 6.

Figure 4B:
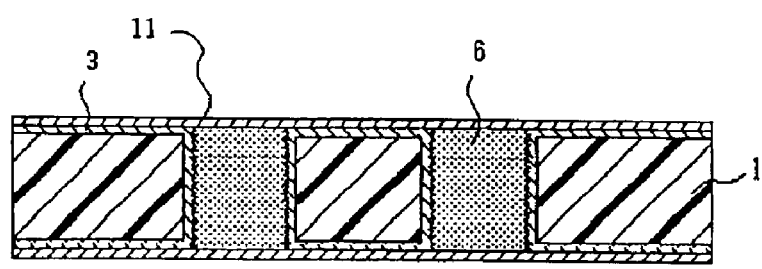

Next, as illustrated in FIG. 4b, a catalyst is applied for electroless copper plating over the entire surfaces of board 1. Another electroless copper plating is performed for thickening to form conductive layer 11 which is referred to as a cap plating layer. This cap plating layer may be omitted as appropriate to proceed to the next step.

Figure 4C:
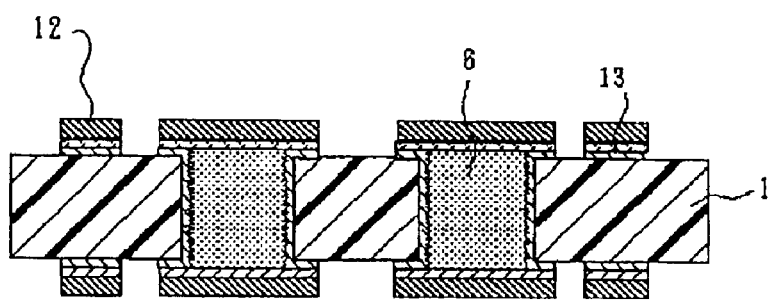

Next, as illustrated in FIG. 4c, a photosensitive resist is printed on board 1, and a pattern is exposed and developed to form etching resist 12. This etching resist 12 is used as a mask to etch conductive layers 3 and 11 to form conductive path 13. Further, for improving an adhering force of conductive layer 11 with interlayer insulating resin layer 14 which is stacked on conductive layer 11 in a subsequent step, the surface of conductive layer 11 is roughened. The roughening may be conducted using a blacking reduction solution, a water solution of inorganic acid and peroxide, a water solution of organic acid and cupric complex, and the like.

Figure 4D:
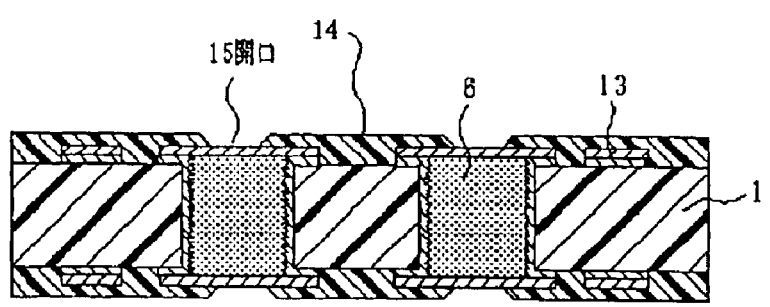

Next, as illustrated in FIG. 4d, interlayer insulating resin layer 14 is formed on board 1 after etching resist 12 is removed, and openings 15 reaching underlying conductive path 13 are formed at predetermined positions on the surface of interlayer insulating resin layer 14. Interlayer insulating resin layer 14 may be made of a thermosetting resin or a thermoplastic resin or a mixture of a plurality of resins. Interlayer insulating resin layer 14 is formed by bonding a resin-added copper foil through thermocompression for lamination, applying an uncured liquid of these resins, or directly bonding a resin film through thermocompression for lamination. When a resin-added copper foil is used, the copper foil is dissolved by etching for removal. An etchant for use in this event may be a ferric chloride solution or the like.

The material used for interlayer insulating resin layer 14 may be an epoxy resin, a BT resin, a polyimide resin, a PPE resin, a phenol resin, a fluorocarbon resin, a silicon resin, a polybutadiene resin, a polyester resin, a melanin resin, a urea resin, a cardo resin, a PPS resin, a PPO resin, and the like. Any one of these resins may be used alone, or a mixture of a plurality of the resins may be used. For providing the insulating layer with photosensitivity, the resin may contain acrylic group or methacrylic group. A filler may be added to the resin. The filler may be an inorganic filler such as silica, barium sulfate, talc, clay, glass, calcium carbonate, titanium oxide, and the like. Instead of an inorganic filler, an organic filler may be used, such as a phenol resin, polymethacrylate polymer, or the like. A mixture of an inorganic and an organic filler may also be used.

Openings 15 are formed in the following manner. When interlayer insulating resin layer 14 is made of a photosetting photosensitive resin, a mask formed with a pattern for shielding predetermined openings are brought into close contact with interlayer insulating resin layer 14 which is exposed to ultraviolet rays, and unexposed portion thereof is developed for removal. When interlayer insulating resin layer 14 is made of a photodegradable photosensitive resin, a mask formed with a pattern for shielding other than predetermined openings is brought into close contact with interlayer insulating resin layer 14 which is exposed to ultraviolet rays, and an exposed portion thereof is developed for removal.

When interlayer insulating resin layer 14 is made of a thermosetting resin, openings 15 are formed with laser light. The laser light may be produced by a carbon dioxide gas laser, a YAG laser, an excimer laser, and the like. A range of wavelength for use in this event may be in an infrared or an ultraviolet region. When an opening is formed with laser light, a thin resin film may occasionally remain on the bottom of the opening, in which case desmear processing is performed. The desmear processing involves swelling the resin with strong alkali or the like, and dissolving the resin for removal using an oxidizing agent comprised of a water solution of chromic acid, permanganate, and the like. Alternatively, the resin may be removed by sand blasting using an abrasive or by plasma processing.

After openings 15 are formed through interlayer insulating resin layer 14, the surfaces are roughened as required. Generally, when a thermosetting resin or a thermoplastic resin is used, the surfaces can be effectively roughened by using an oxidizing agent comprised of a water solution of chromic acid, permanganate, and the like.

Figure 4E:
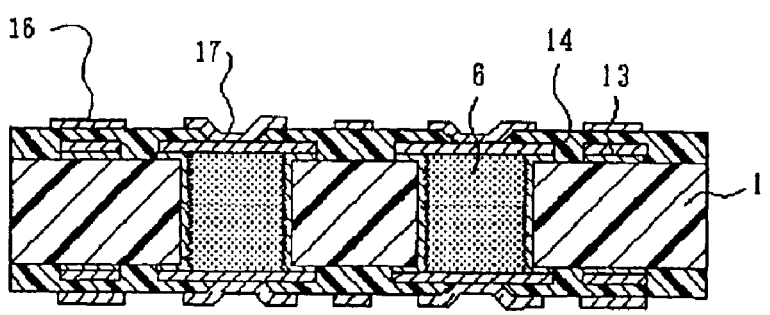

Next, as illustrated in FIG. 4e, after a conductive layer is formed on the surface of interlayer insulating resin layer 14 through electroless copper plating and electro-copper plating, the conductive layer is patterned by a normal etching technique to form conductive path 16, thereby completing a multi-layered build-up wiring board which has via holes 17 formed in openings 15. For further forming an additional layer, the steps illustrated in FIGS. 4d and 4e are repeated.

Generally, a photosensitive liquid solder resist material is further printed on both sides of the multi-layered build-up wiring board by a screen printing method, and a masking film is brought into close contact with the board, exposed, and developed to form a solder resist.

Referring next to FIGS. 5a to 5d, description will be made on a method of manufacturing a multi-layered build-up wiring board using the resin filled board (core board) manufactured in the second embodiment. While the method described below relates to a method which is based on a semi-additive method to manufacture a multi-layered build-up wiring board, it should be understood that a full-additive method may be employed instead in the method of manufacturing a multi-layered build-up wiring board according to the present invention.

Figure 5A:
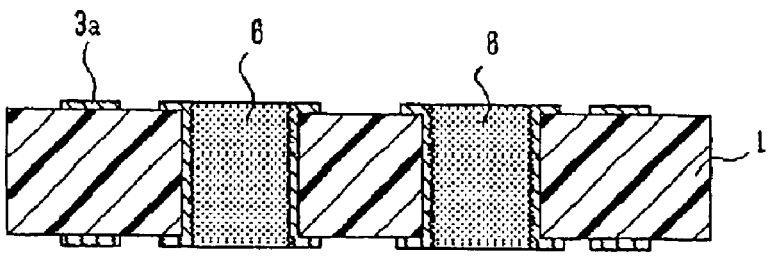
FIGS. 5a to 5d are cross-sectional views of a main portion of a board for describing steps in a method of manufacturing a multi-layered build-up wiring board using the resin filled board manufactured by the method described with reference to FIGS. 3a to 3e.

First, as illustrated in FIG. 5a, a resin filled board was prepared as manufactured by the manufacturing method described in connection with FIGS. 3a to 3e. A glass fiber contained epoxy resin copper-clad laminate was used for insulating board 1, while an epoxy resin was used for filling resin 6.

Figure 5B:
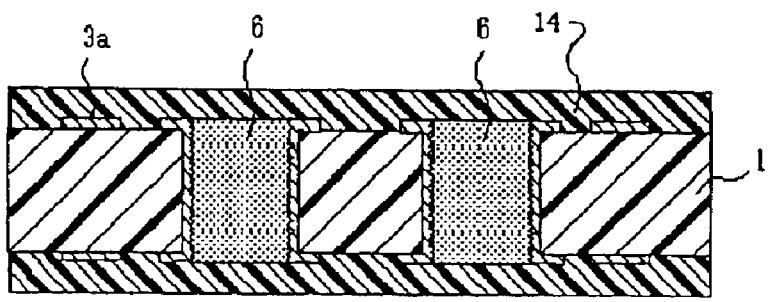
Figure 5C:
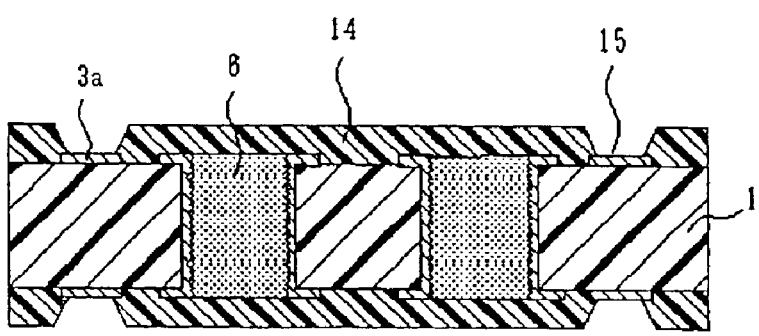

Next, as illustrated in FIG. 5b, interlayer insulating resin layer 14 was formed on both sides of the resin filled board. As illustrated in FIG. 5c, openings 15 reaching underlying conductive path 3a was formed through interlayer insulating resin layer 14 by the approach illustrated in FIG. 3a to 3e. After openings 15 are formed through interlayer insulating resin layer 14, the surfaces are roughened as required. Generally, when a thermosetting resin or a thermoplastic resin is used, the surface can be effectively roughened using an oxidizing agent comprised of a water solution of chromic acid, permanganate, and the like.

Figure 5D:
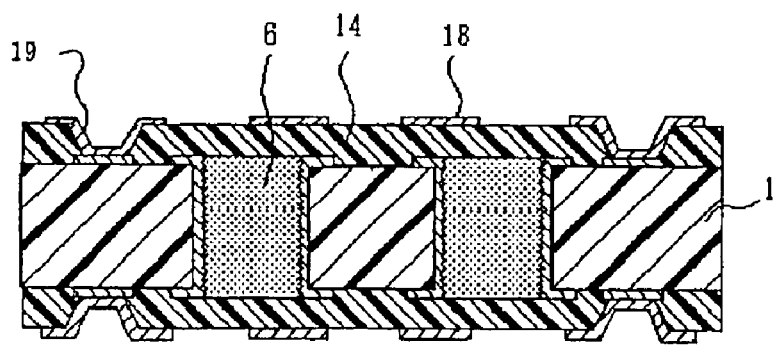

Next, as illustrated in FIG. 5d, after a conductive layer is formed on the surface of interlayer insulating resin layer 14 through electroless copper plating and electro-copper plating, the conductive layer is patterned by a normal etching technique to form conductive path 18, thereby completing a multi-layered build-up wiring board which has via holes 19 formed in openings 15. For forming a larger number of layers, the steps illustrated in FIGS. 5c and 5d are repeated.

Figure 6:
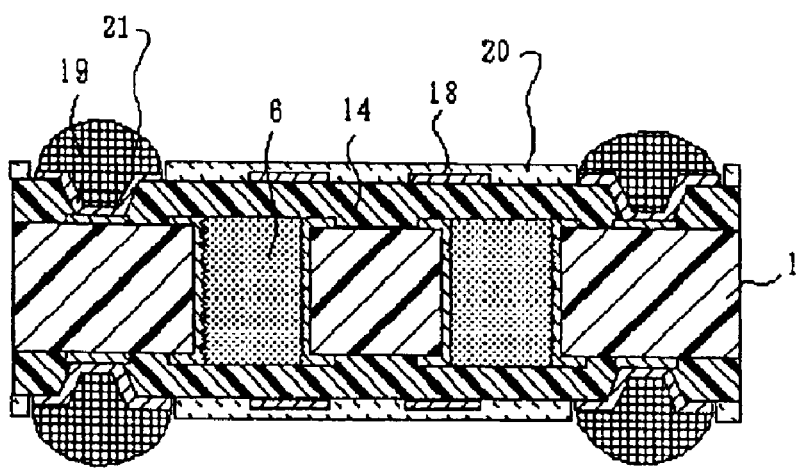
FIG. 6 is a cross-sectional view illustrating exemplary formation of a solder resist and solder bumps on the multi-layered build-up wiring board manufactured by the method described with reference to FIGS. 5a to 5d.

Generally, a photosensitive liquid solder resist material is further printed on both sides of the multi-layered build-up wiring board by a screen printing method, and a masking film is brought into close contact with the board, exposed, and developed to form a solder resist. FIG. 6 is a cross-sectional view which illustrates an exemplary multi-layered build-up wiring board manufactured by the manufacturing method described with reference to FIGS. 5a to 5d, wherein solder resist 20 is formed on the multi-layered build-up wiring board, and bumps 21 are formed in via holes 19.

While preferred embodiments of the present invention have been described using specific forms, such description is for illustrative purposes only, and it is to be understood that changes and variations may be made without departing from the spirit or scope of the following claims.

What is claimed is:

1. A method of manufacturing a resin filled board having a throughhole extending therethrough, and conductive layers formed on a top and a bottom of said board, said throughhole being filled with a resin, said method comprising:

forming a roughened surface on said conductive layer in said throughhole before said throughhole is filled with said resin;

forming smooth surfaces on said conductive layers formed on the top and bottom of said board;

then printing said resin using a mask having an opening at a position corresponding to said throughhole to selectively fill said throughhole with said resin; and curing said resin.

2. The method of manufacturing a resin filled board according to claim 1, wherein said board having said throughhole filled with said resin is prepared by forming a hole extending through a copper-clad laminate or an insulating board, and plating copper over said board.

3. The method of manufacturing a resin filled board according to claim 1, wherein the formation of the roughened surface on the surface of said conductive layer in said throughhole and the smooth surfaces on said conductive layers formed on the top and bottom of said board includes chemically treating the surfaces of said conductive layers in said throughhole and on the top and bottom of said board to form roughened surfaces on said conductive layers in said throughhole and on the top and bottom of said board, and mechanically polishing only the surfaces of said conductive layers on the top and bottom of said board to form the smooth surfaces on said conductive layers on the top and bottom of said board.

4. The method of manufacturing a resin filled board according to claim 3, wherein said chemical treatment is made using a blackening reduction solution, a water solution of peroxide, a water solution of inorganic acid and peroxide, or a water solution of organic acid and cupric complex.

5. The method of manufacturing a resin filled board according to claim 3, wherein said surfaces of said conductive layer are mechanically polished using a buff.

6. The method of manufacturing a resin filled board according to claim 1, wherein said board filled with said resin includes said conductive layers on the top and bottom of said board previously patterned into a predetermined pattern, said patterned conductive layers having smoothed surfaces including portions around said throughhole on the top and bottom of said board.

7. The method of manufacturing a resin filled board according to claim 1, wherein said mask comprises a screen plate or a metal mask.

8. The method of manufacturing a resin filled board according to claim 1, wherein said opening of said mask has a diameter 1.1 to 2.5 times larger than the diameter of said throughhole.

9. The method of manufacturing a resin filled board according to claim 1, further comprising:
mechanically polishing a portion of said resin excessively protruding from said board for removal to planarize the surfaces of said board after printing said resin to selectively fill said throughhole with said resin, and curing said resin.

10. The method of manufacturing a resin filled board according to claim 1, wherein said resin is a thermosetting resin or a photo-thermosetting resin.

11. The method of manufacturing a resin filled board according to claim 1, wherein said resin is a thermosetting resin including a conductive powder.

12. A method of manufacturing a multi-layered printed wiring board, comprising the steps of:
forming a board having a throughhole by forming a hole through a copper-clad laminate or an insulating board and forming a first conductive layer by copper plating on the surface of said board including the wall of said hole;
roughening the surface of said first conductive layer on said board including said throughhole by a chemical treatment;
mechanically polishing said roughened surface of said board for planarization;
then printing a resin using a mask having an opening at a position corresponding to said throughhole to fill said resin in said throughhole, and curing said resin;
mechanically polishing a portion of said resin excessively formed on the surface of said throughhole for removal to planarize the surface of said board;
patterning said first conductive layer on the surface of said board;
forming an insulating resin layer on at least one side of said board; and
forming a second conductive layer on the surface of said insulating resin layer.

13. A method of manufacturing a multi-layered printed wiring board, comprising the steps of:
forming a board having a throughhole by forming a hole through a copper-clad laminate or an insulating board and forming a first conductive layer by copper plating on the surface of said board including the wall of said hole;
roughening the surface of said first conductive layer on said board including said throughhole by a chemical treatment;
mechanically polishing said roughened surface of said board for planarization;
then patterning said first conductive layer on the surface of said board;
then printing a resin using a mask having an opening at a position corresponding to said throughhole to fill said resin in said throughhole, and curing said resin;
mechanically polishing a portion of said resin excessively formed on the surface of said throughhole for removal to planarize the surface of said board;
forming an insulating resin layer on at least one side of said board; and
forming a second conductive layer on the surface of said insulating resin layer.

* * * * *